United States Patent [19]
Burr

[11] Patent Number: 6,121,666
[45] Date of Patent: *Sep. 19, 2000

[54] SPLIT GATE OXIDE ASYMMETRIC MOS DEVICES

[75] Inventor: James B. Burr, Foster City, Calif.

[73] Assignee: Sun Microsystems, Inc., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/884,152

[22] Filed: Jun. 27, 1997

[51] Int. Cl.$^7$ .................................................. H01L 29/76
[52] U.S. Cl. ........................ 257/408; 257/344; 257/404; 257/345
[58] Field of Search .................... 257/407, 412, 257/345, 344, 404, 408, 326; 438/291

[56] References Cited

U.S. PATENT DOCUMENTS

| | | | |
|---|---|---|---|
| 3,719,866 | 3/1973 | Naber et al. | 257/326 |
| 3,877,055 | 4/1975 | Fisher et al. | 257/326 |
| 4,173,818 | 11/1979 | Bassous et al. | |
| 4,939,571 | 7/1990 | Nishizawa et al. | |
| 4,949,140 | 8/1990 | Tam | |
| 5,031,008 | 7/1991 | Yoshida | |
| 5,422,505 | 6/1995 | Shirai | 257/345 |
| 5,536,959 | 7/1996 | Kellam | |
| 5,567,629 | 10/1996 | Kubo | 438/291 |
| 5,658,811 | 8/1997 | Kimura et al. | 438/291 |
| 5,741,737 | 4/1998 | Kachelmeier | 438/286 |
| 5,744,994 | 4/1998 | Williams | |
| 5,753,952 | 5/1998 | Mehrad | 257/317 |
| 5,766,998 | 5/1998 | Tseng | 438/291 |
| 5,780,902 | 7/1998 | Komuro | |
| 5,780,912 | 7/1998 | Burr et al. | 257/344 |
| 5,801,416 | 9/1998 | Choi et al. | |

FOREIGN PATENT DOCUMENTS

| | | |
|---|---|---|
| 59-124161 | 7/1984 | Japan. |
| 64-37055 | 2/1989 | Japan. |
| 401185971 | 7/1989 | Japan ................................ 257/355 |

OTHER PUBLICATIONS

George A. Sai–Halasz, "High Transconductance and Velocity Overshoot in NMOS Devices at the 0.1–um Gate–Length Level" IEEE Electron Device Letters, vol. 9, No. 9, Sep. 1988.

R. Jayaraman et al., "Comparison of High Voltage Devices for Power Integrated Circuits".

(List continued on next page.)

*Primary Examiner*—Tom Thomas
*Assistant Examiner*—Ori Nadav
*Attorney, Agent, or Firm*—Gunnison, McKay & Hodgson, LLP; Philip J. McKay

[57] ABSTRACT

A method for making an asymmetric MOS device having a notched gate oxide is disclosed herein. Such MOS devices have a region of a gate oxide adjacent to either the source or drain that is thinner than the remainder of the gate oxide. The thin "notched" region of gate oxide lies over a region of the device's channel region that has been engineered to have a relatively "high" threshold voltage (near 0 volts) in comparison to the remainder of the channel region. This region of higher threshold voltage may be created by a pocket region of increased dopant concentration abutting the source or the drain (but not both) and proximate the channel region. The pocket region has the opposite conductivity type as the source and drain. A device so structured behaves like two pseudo-MOS devices in series: a "source FET" and a "drain FET." If the pocket region is located under the source, the source FET will have a higher threshold voltage and a much shorter effective channel length than the drain FET. If the pocket region is located under the drain, the reverse arrangement will be true. The region of thin gate oxide (the notched region) provides a higher gate capacitance than the remaining regions of thicker gate oxide. Thus, the channel region under the notched region of gate oxide has a relatively high concentration of mobile charge carriers in the channel region.

8 Claims, 6 Drawing Sheets

OTHER PUBLICATIONS

Junko Tanaka et al., "A Sub–01–um Grooved Gate MOSFET with High Immunity to Short–Channel Effects" International Electron Devices Meeting Technical Digest 1993, pp. 537–540.

Wen–Ling Margaret Huang et al., "TFSOI Complementary BiCMOS Technology for Low Power Applications" IEEE Transactions on Electron Devices, vol. 3, Mar. 1995.

W.R. Hunter et al., "A New Edge–Defined Approach for Submicrometer MOSFET Fabrication" IEEE Electron Device Letters, vol. Edl–2, No. 1, Jan., 1981.

R. H. Yan et al., "High Performance 0.1–um Room Temperature Si MOSFETs", 1992 Symposium on VLSI Technology Digest of Technical Papers, pp. 86–87.

M. Aoki et al., "0.1 um CMOS Devices Using Low–Impurity–Channel Transistors (LICT)", IEDM 90–939–90–941.

Hisao Yoshimura et al., "New CMOS Shallow Junction Well FET Structure (CMOS–SJET) for Low Power–Supply Voltage".

James B. Burr et al., "Energy Considerations in Multichip–Module based Multiprocessors".

J. Burr et al., "Ultra Low Power CMOS Technology".

Jim Burr, "Stanford Ultra Low Power CMOS".

James B. Burr et al., "A 200mV Self–Testing Encoder/Decoder using Stanford Ultra–Low–Power CMOS", 1994 IEEE International Solid–State Circuits Conference.

Feb. 25, 1994 Meeting Notes by Dr. James B. Burr et al.

Yoshinori Okumura et al., "Source–to–Drain Nonuniformly Doped Channel (NUDC) MOSFET Structures for High Current Drivability and Threshold Voltage Controllability" IEEE Transactions on Electron Device vol. 39, No. 11, Nov. 1992.

SPLIT GATE OXIDE ASYMMETRIC MOS DEVICES

CROSS-REFERENCE TO RELATED APPLICATIONS

This application is related to: U.S. patent application Ser. No. 08/357,436, filed Dec. 16, 1994, entitled ASYMMETRIC LOW POWER MOS DEVICES, and naming Burr and Brassington as inventors; U.S. patent application Ser. No. 08/884,286, filed Jun. 27, 1997, entitled NOTCHED GATE OXIDE ASYMMETRIC MOS DEVICES, and naming James Burr as inventor; U.S. patent application Ser. No. 08/883,829, filed Jun. 27, 1997, entitled, METHOD FOR FORMING A NOTCHED GATE OXIDE ASYMMETRIC MOS DEVICE and naming James Burr as inventor; all of which are assigned to the assignee of the present invention and incorporated herein by reference in their entirety for all purposes.

BACKGROUND OF THE INVENTION

The present invention generally relates to MOS devices and the gates employed in such devices. More specifically, the invention relates to asymmetric MOS devices having notched gate oxides.

In digital MOS circuits, performance may be approximated by the ratio of drive current through the circuit to the load being switched by the circuit.

$$f = I/Q$$

In this expression, I is equal to the drive current through the transistors in the circuit, Q is the charge on the output of a circuit (the load), and f is the operating frequency of the circuit—which is a measure of performance. Thus, a digital circuit's performance can be improved by increasing its drive current and/or decreasing its load.

The drive current is given by the following expression:

$$I = rv$$

In this expression, r represents the linear charge density (or charge per unit length) in MOS device channel and v represents the average velocity of the charge carriers in that channel. Thus, current can be increased by increasing either the linear charge density, the charge carrier average velocity, or both along the drive current path in an MOS device.

Charge carriers in conventional MOS devices move in one of two velocity regimes demarcated by the field strength across the device channel. The first regime, known as subsaturation, is encountered at relatively low lateral field strengths, such as are commonly found in long channel devices (e.g., devices in which the effective channel length is greater than about 2 $\mu$m). Here velocity increases linearly with the lateral field, e, across the channel. As the lateral field increases, so does the charge carrier velocity. At some point, however, the second velocity regime is reached: a regime referred to as "saturation." Here the increasing lateral field strength has reached or exceeded a critical field strength (ecritical) at which the velocity is no longer a linear function of field strength. Rather the carrier velocity remains constant at a "saturation velocity" (vsat) with increasing field strength. Both vsat and ecritical are material properties of the semiconductor in which conduction takes place.

Typically, velocity saturation is observed in short channel devices (i.e., those devices in which the effective channel length is less than about 1 $\mu$m). This is because the source-drain potential drop in such devices takes place over a rather short distance, and therefore the lateral field strength is relatively large.

It should be understood that the carrier velocity described here is actually an average velocity taken over all carriers in the device channel. In most devices, some carriers will be in the saturation regime while others will be in the subsaturation regime.

Physically, at velocity saturation, the carriers have reached a fundamental limit in velocity as determined by their interactions with optical phonons of the semiconductor lattice. Thus, it may appear that, in terms of velocity, no greater performance can be realized beyond saturation velocity. In fact, however, a third velocity regime exists: ballistic transport. This regime exists in systems where the mean free path of the charge carriers is on the order of the distance that the carriers must travel. In single crystal silicon, the mean free path is on the order of about 50 to 1000 Å. At these distances, phonons do not mediate charge carrier transport. Rather, the carriers accelerate under the applied lateral field as if they were in a vacuum so that their velocity increases in proportion to the square root of the potential. Thus at relatively moderate potentials, ballistic electrons can reach velocities greatly exceeding saturation velocity.

Not surprisingly, devices in which ballistic transport plays a significant role may possess greatly improved performance. For silicon-based MOS technology, such devices would have to have an effective channel length of about 0.1 $\mu$m (1000 Å) or less. Unfortunately, conventional optical lithography techniques (which are employed to manufacture most MOS integrated circuits today) likely can not produce such small feature sizes without great effort. While X-ray lithography could, in theory, produce devices having such small effective channel lengths, significant technical hurdles remain before feature sizes of this magnitude can be routinely implemented in mass production.

Recently, asymmetric MOS devices fabricated by conventional optical lithographic techniques have been proposed (see the above-referenced U.S. patent application Ser. No. 08/357,436). The channel region in such devices likely can be made short enough that some electrons will move by ballistic transport. These devices include—in addition to conventional MOS device elements—a pocket region of relatively high dopant concentration abutting either the device's source or drain along the side of the source or drain that faces the device's channel region. Because the pocket region abuts only one of the source or drain, the device is deemed "asymmetric."

As explained in U.S. patent application Ser. No. 08/357,436, it is believed that such asymmetric devices behave like two pseudo-MOS devices in series: a "source FET" and a "drain FET," one of which has a higher threshold voltage by virtue of the pocket region. An asymmetric MOS device having such structure will switch on as follows. At a very low (typically less than −1 volt for an NFET) gate voltage, neither the shorter nor longer channel pseudo-device is switched "on." That is, neither pseudo-device's channel region has undergone inversion. However, at slightly higher gate potentials where MOS devices are normally switched off (e.g., about −1 volt), the threshold of the longer channel pseudo-device is exceeded, and that device therefore has switched on. Nevertheless, such gate voltages still do not exceed the level at which the shorter channel pseudo-device switches on. Thus, no current flows between the source and drain yet. As the gate voltage increases and surpasses the shorter channel pseudo-device's threshold voltage (typically at about 0 volts), that device also switches on allowing current to flow between the source and drain. In short, the device switches on in two stages, and does not completely switch on until the gate voltage exceeds the short channel pseudo-device's threshold voltage.

If an asymmetric MOS device is operated such that the gate voltage only slightly exceeds the threshold voltage of the shorter channel pseudo-device, the performance of the overall MOS device will be governed by the performance of that pseudo-device. This is very desirable if the shorter channel pseudo device has an effective channel length on the order of 1000 Å or less. As noted, at such short lengths, some charge carriers ballistically jump across the channel.

While the described asymmetric MOS devices appear to reach the high-performance ballistic transport regime, further performance-improving enhancements to such devices may be attainable.

SUMMARY OF THE INVENTION

The present invention provides asymmetric MOS devices having notched gate oxides. Such MOS devices have a thin "notch region" of their gate oxide adjacent to either the source or drain and lying over a region of the device's channel region that has been engineered to have a relatively "high" threshold voltage (on the order of 150 mV or less) in comparison to the remainder of the channel region. One such device has a pocket region (as described above) of increased dopant concentration abutting the source or the drain (but not both) and proximate the channel region. As noted above, a device so structured behaves like two pseudo-MOS devices in series: a "short channel FET" and a "longer channel FET." The pocket region is located under the short channel FET and imparts to it a "higher" threshold voltage than the longer channel FET. When such a device switches on, it does so in two stages. At the second stage, substantially all of the current is carried through a short channel pseudo-FET adjacent the pocket region.

The region of thin gate oxide (the notch region) provides a higher gate capacitance than the remaining thicker regions of gate oxide. Thus, the channel region under the notch region of gate oxide has a relatively high concentration of mobile charge carriers (r) in the channel region. When such device is designed with the notch gate oxide above a short channel pseudo-FET, as described, the drive current is increased due to the high concentration of mobile charge carriers in the short channel pseudo-FET region. Thus, the present invention improves on the above-described asymmetric device by increasing the device's drive current locally under the notch. As explained below, this increase in drive current is obtained without a significant penalty in load (Q).

In one aspect, the present invention provides an asymmetric MOS device that can be characterized as including the following features: (1) a bulk region in the semiconductor substrate of a first conductivity type; (2) source and drain regions positioned within the bulk region and being of a second conductivity type; (3) a channel region located along the substrate's active surface and between the source and drain regions, the channel region having an associated channel length representing the distance in the channel region between the source and drain regions; (4) a gate dielectric layer positioned over the channel region and having a notch region over a portion of the channel region; and (5) a gate electrode positioned over the gate dielectric. In this device, the portion of the channel region located under the notch region should have a higher threshold voltage than the remainder of the channel region to ensure that the device's drive current is increased. Further, the notch region should extend to an edge of the gate dielectric on either the source or the drain side of the MOS device.

In some embodiments, the channel region underlying the notch region is provided with a relatively high threshold voltage (on the order of 150 mV or less) by a pocket region of the first conductivity type, which pocket region abuts one of the source or drain regions and is located proximate the channel region. The pocket region should have an average concentration of dopant atoms of the first conductivity type, which average concentration is greater than the bulk region's average concentration of dopant atoms. In other embodiments, the pocket region has an average dopant concentration of the first conductivity type of at least about $1 \times 10^{16}$ cm−3, while the portion of the channel region outside the pocket region has an average concentration of dopant atoms of the first conductivity type of at most about $1 \times 10^{16}$ cm−3. In still other embodiments, to lower the device's threshold voltages, its channel region includes counter dopant of the second conductivity type.

In general, the MOS devices of this invention should have a rather low threshold voltage. Such "low" threshold devices may be characterized by an on current and an off current, with the ratio of the on current to the off current being not greater than about $10^5$. Preferably, the device has a threshold voltage of between about 150 mV in the portion of the channel region located under the notch.

The gate dielectric may be characterized as follows. It will have a thickness ratio between the unnotched and notched regions in the range of about 2 and 20, and more preferably in range of about 10 and 15. In one embodiment, the notch region of the gate dielectric has a thickness of at most about 65 Å, and, in another embodiment, between about 25 and 35 Å. Further, the unnotched region of the gate dielectric preferably has a thickness of at least about 100 Å, and more preferably between about 200 and 400 Å.

In a second aspect, the present invention provides a method of forming an MOS transistor in a semiconductor substrate. The method may be characterized as including the following steps: (1) providing a bulk region having a first conductivity type in the semiconductor substrate; (2) forming a notched gate dielectric and a gate electrode over a portion of the bulk region defining a channel region, the notched gate dielectric having a notch region as described above; and (3) forming source and drain regions of a second conductivity type separated by the channel region. The method can also include a step of forming a pocket region as described above such that the pocket region and the notch region lie on same side of the channel region.

In one embodiment, the step of forming the notched gate dielectric and gate electrode is carried out with the following substeps: (1) forming a first gate dielectric layer of a first thickness over the semiconductor bulk region; (2) forming a first polysilicon layer over the first gate dielectric layer; (3) patterning the first gate dielectric layer and the first polysilicon such that they remain over only a first portion of the channel region; (4) forming a second gate dielectric layer of a second thickness which is less than the first thickness, the second gate dielectric being located adjacent to the first gate dielectric layer remaining after the step of patterning, the second gate dielectric also being located over at least a second portion of the channel region, which second portion of the channel region is located outside of the first portion of the channel region; (5) conformally forming a second polysilicon layer over at least the second gate dielectric and the first polysilicon layer; and (6) anisotropically etching the second polysilicon silicon layer such that the notched gate dielectric is formed having as its notch region the second gate dielectric layer overlying the second portion of the channel region. Preferably, the conformally deposited second polysilicon layer is at most about 0.1 μm thick. This ensures that during the step of anisotropically etching, the notch region of the gate dielectric will be no more than about 0.1 μm in length.

In a third aspect, the present invention provides an MOS device on a semiconductor substrate having a "split gate." This MOS device may be characterized as including the following elements: (1) a bulk region in the semiconductor substrate of a first conductivity type; (2) source and drain regions positioned within the bulk region and being of a second conductivity type; (3) a channel region located along the substrate's active surface and between the source and drain regions; (4) a gate dielectric layer positioned over the channel region; and (5) a split gate electrode positioned over the gate dielectric. The split gate electrode is divided into two sections: a first lateral section of the first conductivity type and a second lateral section of the second conductivity type. This causes the MOS device to have a locally high threshold voltage proximate to the first lateral section and a locally low threshold voltage proximate to the second lateral section. In one embodiment, the first lateral section is much shorter than the second lateral section so that the device acts as short channel pseudo-FET in series with a long channel pseudo-FET as described above in connection with the discussion of devices having pocket regions. In order to bring the threshold voltages of the pseudo devices down to the levels discussed above, the split gate devices preferably are counter doped throughout their channel region.

In some embodiments, the lateral sections are degenerately doped. Thus, the dopant concentration in both the first and second lateral sections is about $10^{20}$ cm-3 or greater, albeit of different dopant types. In further embodiments, the first lateral section is no more than about 0.1 μm in length and is located over a notch region of the gate dielectric as described above. In still further embodiments, the MOS device will be provided with some form of punch through protection. This may be a pocket region as described above. Alternatively, it may be a buried electrode having the first conductivity type and being located beneath the channel region. Such buried electrode will have an average dopant concentration which is greater than an average dopant concentration of the bulk region.

These and other features and advantages of the present invention will become apparent to those skilled in the art upon reading the following description and studying the associated figures.

DETAILED DESCRIPTION OF THE INVENTION

The Structure of Notched Gate Dielectric Devices

In the following description of embodiments of the invention, certain dopant concentrations in MOS devices are specified. It should be understood that these concentrations are presented as examples only. Specifically, the listed concentrations are most appropriate for MOS devices having drawn channel region lengths of about 0.35 μm (corresponding to effective channel lengths of about 0.25 μm). It should also be understood that, in general, dopant concentrations in devices should vary inversely with device size; that is, as device sizes decrease, dopant concentration should increase. Thus, for devices smaller than 0.35 μm in channel width, the concentration ranges listed herein should be increased. This is because depletion regions created by p-n junctions adjacent source and drain regions must scale with channel region width to prevent punch through. In other words, as channel region widths decrease, the depletion regions must also decrease so that they do not span the entire channel region and thereby lead to punch through. The size of depletion regions can be limited by increasing the dopant concentrations at the locations where the depletion regions form. Hence, the dopant concentrations should increase with decreasing device sizes.

As this invention is not limited to 0.35 μm technology, the concentrations set forth below should not be considered to limit the invention. Therefore, it should be expected that the concentrations will increase as necessary to reduce depletion region sizes in smaller devices (less than about 0.35 μm devices), and may likewise decrease as appropriate in longer channel devices.

Throughout this specification, the term "channel region" will be used frequently. That term, as used herein, refers to the entire electrically active region between the source and drain, not just the inversion layer formed when the gate voltage exceeds Vt.

Figure 1A:
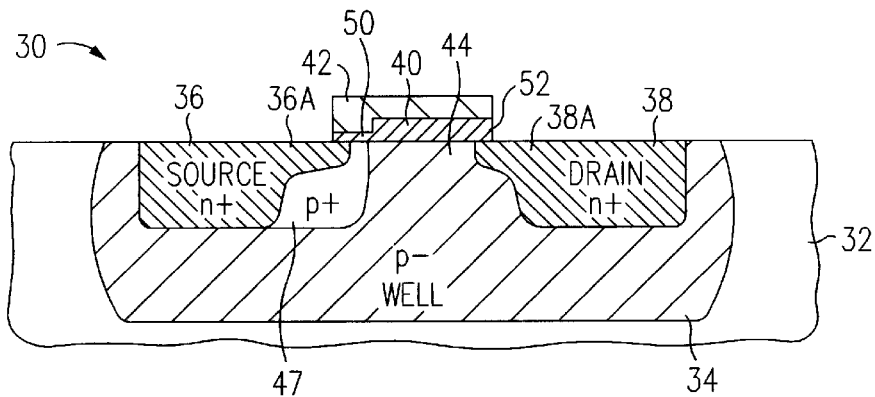
FIG. 1a is a side sectional view of an asymmetric MOS transistor having a notched gate oxide and a pocket region in accordance with one embodiment of the present invention.

Turning now to FIG. 1a, a side sectional view of an asymmetric MOS device 30 is shown. Device 30 includes a lightly doped p-type well region 34 extending downward from the surface of a semiconductor substrate 32 into its bulk. Preferably, this well region—excluding the source, drain, and pocket regions described subsequently—has an average dopant concentration of between about $1 \times 10^{14}$ and $5 \times 10^{16}$ cm-3. Provided within well region 34 are (1) a heavily doped n-type source region 36 with an associated "tip" 36A, and (2) a corresponding heavily doped drain region 38 with an associated tip 38A. In one embodiment, the dopant concentrations of the source region 36 and the drain region 38 are each in the range of between about $1 \times 10^{20}$ and $1 \times 10^{21}$ cm-3, and the dopant concentrations of the tips are in the range of between about $1 \times 10^{19}$ and $1 \times 10^{20}$ cm-3. In some embodiments, the source and drain (or one of the two) will be shaped such that they do not have tips; rather they will include only plug portions which extend up to the channel region. As such devices have lower source or drain resistances (in comparison to their tipped counterparts), they are preferred in some embodiments. Unfortunately, punch through is more likely to be a problem in such devices. Therefore, in some embodiments, a three level source/drain having a plug region, a tip region, and an intermediate region extending down from the substrate surface by a distance intermediate that of the plug and tip regions and extending toward the channel by a distance intermediate that of the plug and tip regions.

It should be noted that the specific transistor 30 shown in FIG. 1a is an NFET, i.e., it has an n-type source, an n-type drain, and a p-type well. Although not shown, transistor 30 could also be a PFET transistor having a p-type source, a p-type drain, and an n-type well. In that case, the dopant concentrations specified herein for NFETs would apply with equal validity to the PFET—only the dopant conductivity types would be reversed. It should also be noted that in some embodiments, the bulk semiconductor 32 may be provided with a sufficiently high p-type dopant concentration (in the case of an NFET) that no well region is required. In such cases, the source and drain regions can be formed directly in the bulk. Of course, if both p-type and n-type devices are formed on the same semiconductor substrate 32, the p-type devices will have to be formed in lightly doped n-type wells—assuming that the substrate is lightly doped with p-type dopants.

A channel region 44 is provided in the device 30 between the source and drain tip regions 36A and 38A. As noted, the dopant concentrations presented herein are most appropriate for devices having drawn channel lengths of about 0.35 $\mu$m. However, it should be borne in mind that many advantages of the asymmetric structure of this invention also apply to longer channel devices, so long as the supply voltage is maintained at a relatively low level. Given the dopant concentration ranges recited herein, the devices of the present invention typically have drawn channel lengths of about 2 $\mu$m or less (i.e., the inner boundaries of the device's source and drain tips should be no more than about 2 $\mu$m apart), and are more often in the range of about 0.5 $\mu$m or less.

The dopant concentration in channel region 44 directly affects the threshold voltage of the MOS device. In some embodiments, the devices of this invention will have unconventionally low threshold voltages, and, as a result, the channel region dopant concentration should be carefully controlled. Generally, as the p-type dopant concentration decreases in the channel region (of an NFET), the threshold voltage also decreases. Thus, it is generally desirable in the context of this invention to provide a rather low p-type dopant concentration in channel region 44. In one embodiment, channel region 44 has a p-type dopant concentration of less than about $1\times10^{16}$ cm–3 (more preferably between about $1\times10^{14}$ and $1\times10^{16}$ cm–3, and often about $1\times10^{15}$ cm–3). Such low channel region doping concentrations allow the device threshold voltage to be set at or near zero volts (either positive or negative). Such low concentrations also provide a high charge carrier mobility by minimizing impurity scattering.

In other embodiments, the channel region is counter doped with an n-type dopant to achieve even lower threshold voltages. often, the counter dopant concentrations are in the range of about $10^{16}$ to $10^{18}$ cm–3. Special considerations associated with counter doping will be discussed below.

A pocket region (sometimes referred to as an "asymmetric halo") 47 is provided in well 34 underlying the source tip region 36A. As shown, pocket region 47 extends slightly into and under a portion of the channel region 44. The pocket region 47 has a somewhat higher dopant concentration than the surrounding p-region of well 34. in one embodiment, the dopant concentration of pocket region 47 is between 10 and 1000 times greater than the dopant concentration in the well.

Thus, the pocket region 47 should have a net dopant concentration of at least about $1\times10^{16}$ cm–3, and often between about $1\times10^{17}$ and $1\times10^{18}$ cm–3. In this invention, the pocket region is provided on only one side of the device: i.e. on either the source side or the drain side. Thus, in FIG. 1a, no pocket region appears under the drain tip 38A. Of course, the present invention does not foreclose the possibility that some small regions of relatively high p-type dopant concentration will be found proximate the drain region (e.g., to prevent punch through or reduce well resistance). However, to ensure that the device has the benefits described herein, any such local variations should be limited in size and/or dopant concentration.

In the embodiment shown in FIG. 1a, the pocket region 47 extends only very slightly into the channel region 44. This is in keeping with a design objective that the short channel pseudo-device (a source FET in the case of FIG. 1a) has an extremely short effective channel length. Preferably, the pocket region 47 extends no more than 0.1 $\mu$m into the channel region 44, and more preferably no more than about 500 Å into the channel region. In the alternative embodiments shown in FIGS. 1b and 1c, the pocket region is limited to regions outside of the channel region.

It should be noted that the pocket region may be provided under either the source or drain tip region. For consistency, however, the asymmetric halo device will be described herein as having a pocket region under the source region.

A gate dielectric layer 40 is provided on the surface of the p-type well 34 and overlying the channel region 44. As shown, the gate dielectric includes (1) a notch region 50 adjacent to the source tip 36A and overlying pocket region 47, and (2) an unnotched region 52 spanning the remainder of the channel region length. In general, to provide the device with increased drive current, the notch region 50 should be provided over the side of the channel that is proximate the pocket region. Preferably, the notch region 50 covers at least about 20% of the short channel length (e.g., the distance that the pocket region extends into or under the channel region). Of course, the notch region 50 may actually extend beyond the edge of the short channel toward the drain. However, to prevent the overall gate capacitance from being so large as to negatively impact performance (by making the switching load Q excessively large), the notch region 50 should extend no further than about 30% of the short channel electrical length (e.g., the length of the pocket region in the channel region) beyond the edge of the short channel—toward the drain side.

Although the notched gate dielectric structure may be used with many MOS designs, when it is applied to devices designed to conduct in the ballistic transport regime, it need not extend from the edge of the source tip 36A by more than the channel length of the short channel pseudo-FET. Thus, in many embodiments, the notch region 50 will be no longer than about 1000 Å, often no longer than about 700 Å, and, in some cases, between about 100 and 500 Å.

In some embodiments, gate dielectric layer 40 is preferably silicon dioxide. For 0.35 $\mu$m devices, the notch region 50 is at most about 65 Å thick, more preferably between about 25 and 65 Å thick, and most preferably between about 25 and 35 Å thick. Further, the unnotched region 52 preferably is at least about 65 Å thick, more preferably at least about 100 Å thick, and most preferably between about 200 and 400 Å thick. Within the range of the foregoing values, the gate dielectric 40 typically has a thickness ratio between the unnotched and notched regions in the range of about 2 and 20, and more preferably in range of about 10 and 15. If the notch region becomes too thin for a given threshold voltage (e.g., somewhat thinner than 25 Å for a 0 Vt device), mobility degradation may become a problem due to surface scattering.

A polysilicon gate electrode layer 42 is provided on the oxide layer 40 as shown. In general, either an n-type or p-type gate layer may be provided on either NFETs or PFETs of this invention. However, in a NFET surface channel device of this invention, the gate electrode is doped n-type.

Figure 1B:
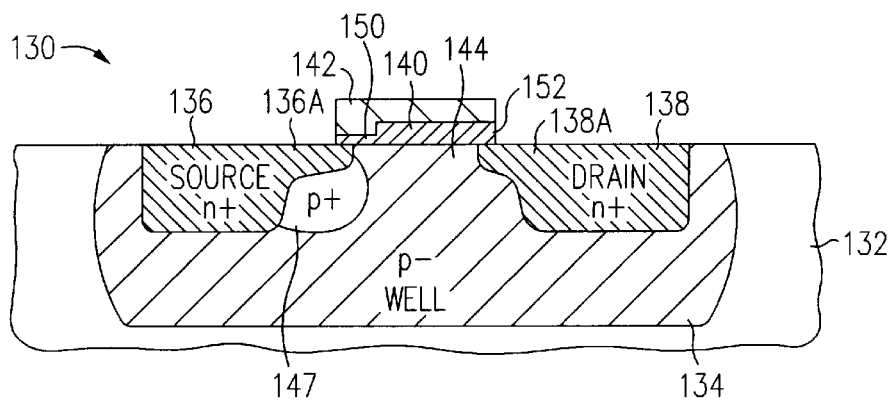
FIG. 1b is a side sectional view of an asymmetric MOS transistor having a notched gate oxide and a pocket region in accordance with a second embodiment of the present invention.
Figure 1C:
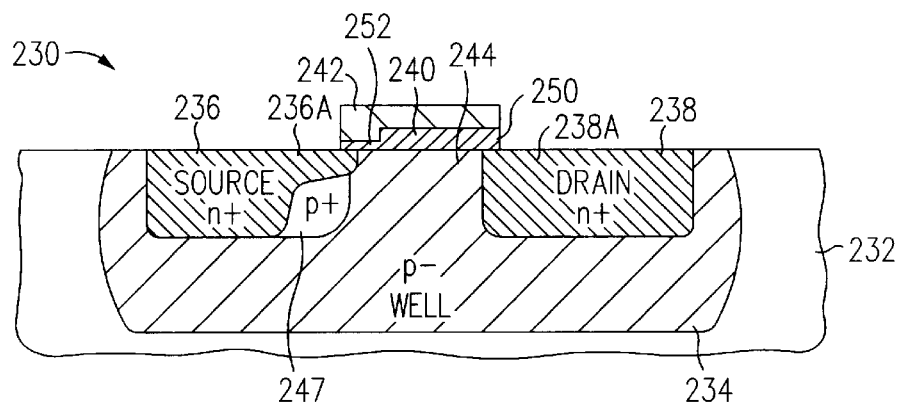
FIG. 1c is a side sectional view of an asymmetric MOS transistor having a notched gate oxide and a pocket region in accordance with a third embodiment of the present invention.

FIGS. 1b and 1c display alternative embodiments of the present invention in which the pocket region underlying the source tip takes on different shapes/locations within the asymmetric MOS device. In FIG. 1b, an asymmetric CMOS device 130 includes a pocket region 147 which extends slightly under (but not into) channel region 144 (compare pocket region 47 of FIG. 1a). Otherwise, this embodiment is quite similar to that depicted in FIG. 1a. Specifically, the device includes a source 136, a drain 138, a well 134, a gate electrode 142, and a gate dielectric 140. Further, the gate dielectric includes a notch region 150 and an unnotched region 152. As device 130 is also an asymmetric device, there is no pocket region under drain 138. The pocket region 147 can be formed by, for example, an implant made at an angle having a horizontal component (left to right as shown in FIG. 1b). Also, region 147 can be formed from a vertical implant which is induced to move laterally relative to the source edge by appropriate annealing. In FIG. 1c, an asymmetric MOS device 230 includes a pocket region 247 that does not extend beyond the edge of source region 236A or into channel region 244. Further, the device is illustrated with a drain 238 that does not include a tip region. This feature could be employed in any of the devices shown in FIGS. 1a–1c, as the pocket region will typically provide adequate punch through protection. The device features shown in FIG. 1c are otherwise the same as those of the embodiments in FIGS. 1a and 1b. Thus, the device includes a source 236, a drain 238, a well 234, a gate electrode 242, and a gate dielectric 240 (with notch region 250 and unnotched region 252). Other structural alternatives to the asymmetric device shown in FIG. 1a are described in U.S. patent application Ser. No. 08/357,436 which was previously incorporated herein by reference.

In the embodiments illustrated in FIGS. 1a–1c, contacts or ties (not shown) are provided for the source, drain, gate, and bulk (well) regions respectively. Such contacts connect these elements to conductive lines patterned on one or more metallization layers disposed above the MOS devices 30, 130, and 230. These various ties are electrically isolated from one another and from the device's gate by an oxide, glass, or other insulating layer (sometimes referred to as a passivation layer). The ties are typically formed of tungsten, aluminum, aluminum/copper alloy, etc. They may be separated from the underlying semiconductor substrate (or gate polysilicon) by a layer of titanium and a layer of titanium nitride to prevent metal species from migrating into the semiconductor and thereby degrading performance.

Low Threshold Voltage Devices

As noted, it is generally preferable to engineer the device so that the threshold voltage in the channel region (at least outside of a short channel pseudo-FET) is as low as possible. For example, in NFETs, a channel region concentration (p-type dopant species) of $10^{15}$ cm-3 may result, under the right conditions, in a −0.3 V threshold voltage. Even lower threshold voltages can be obtained by counter doping the channel region with n-type dopants (in NFETs). For certain devices, counter dopant concentrations in the range of about $10^{16}$ to $10^{18}$ cm-3 result in a "longer channel" pseudo-FET threshold voltage of less than about −1 volts.

When a counter dopant is employed, it should be structured with a concentration profile such that the depletion region emanating from the counter dopant-substrate interface (located below the channel region) does not extend to the silicon-oxide interface (substrate surface); otherwise the drain FET will act as a resistor and a substantial potential drop will occur across it. Thus, the counter dopant region should be thick enough, with a high enough concentration, to avoid becoming fully depleted. Assuming that the counter dopant region is engineered such that the depletion layer does not reach the surface, then a thin conducting layer is formed at the surface.

In some embodiments, the counter dopant will be located somewhat below the semiconductor surface of the device. In other words, the maximum concentration of the counter dopant will lie some distance below the semiconductor/gate dielectric interface. If the location of this maximum concentration is carefully chosen, the charge carriers will flow through the channel region along a conduction pathway that passes above the counter dopant region. This is usually beneficial, as high dopant concentrations degrade the mobility of charge carriers and sometimes decrease conductivity in a semiconductor substrate.

Low threshold devices (such as those preferred for use with this invention) generally have relatively large leakage currents. In the past, when memory logic was the primary focus of integrated circuit design, engineers designed devices to have relatively high threshold voltages and hence very small leakage currents. Such traditional devices are still designed to have a ratio of "on current" to "off current" (a measure of leakage current) of at least about $10^6$ and typically in the range of $10^7$ to $10^8$. While such high ratios may be appropriate for largely inactive circuits such as RAM cells, in more active circuits typically used in microprocessors, the threshold voltage can be substantially lowered. The present invention is primarily concerned with such active devices. Therefore, the devices of the present invention will typically be characterized by a ratio of on current to off current of at most about $10^5$, and more typically about $10^2$–$10^3$. For some highly active devices, the ratio may even be as low as 10. Of course, some method should be employed to control leakage while such normally active circuits are in sleep or standby mode. In terms of absolute threshold voltage, the MOS devices of this invention will typically have a Vt of between about 150 and +150 millivolts. However, this range is not critical to the practice of the invention.

Back-Biasing

By providing light doping and/or counter doping in the channel region of a device, the device's threshold voltage will be near zero. Due to processing variations, the exact dopant concentration in the channel region can vary slightly from device to device. Although these variations may be slight, they can shift a device's threshold voltage by a few tens or even hundreds of millivolts (to outside of the preferred range for operation of this invention). Further, environmental factors such as operating temperature fluctuations can shift the threshold voltage. Still further, low threshold devices may leak too much when their circuits are in sleep or standby mode. Thus, it is desirable to provide a mechanism for tuning the threshold voltage in low threshold voltage devices such as those of this invention. This can be accomplished by using back-biasing, i.e. controlling the potential between a devices well and source. See James B. Burr, "Stanford Ultra Low Power CMOS," Symposium Record, Hot Chips V, pp. 7.4.1–7.4.12, Stanford, Calif. 1993 which is incorporated herein by reference for all purposes.

Back-biasing is accomplished by controlling the potential difference between the source and well regions of the transistor. Typically, the potential will be controlled through isolated ohmic contacts to the source and the well regions together with the circuitry necessary for independently controlling the potential of these two regions. As the potential difference is increased, the magnitude of the threshold voltage increases. In general, a relatively large back-bias voltage is required to adjust the threshold voltage a comparatively small amount. In some embodiments, the device will be engineered such that a shift in threshold voltage of about 100 millivolts is accomplished with about 1 volt of back-bias.

Back-biasing can be implemented using various automatic techniques. In one such method, a feedback amplifier adjusts the bias voltage of a well so that the drain current of a test device in the well matches a reference current. A tuning circuit can be designed to match the off current (in the range of 1 nanoamp to 1 microamp), or the on current (in the range of 100 microamp/micrometer), or some function of both the on and off currents. Such circuits can sample the current from several test devices to obtain average on and off currents. The power dissipation of one of these well-tuning circuits is typically quite small, on the order of 1 microwatt, and its area is also small, typically about 100 square micrometers, so that hundreds or even thousands of such circuits can be distributed throughout an integrated circuit chip without significantly impacting area or power, while substantially improving low voltage performance by providing tightly controlled operating environments over small, local transistor populations.

In other embodiments, back-biasing is accomplished by controlling the potential of the MOS device's pocket region—as opposed to merely controlling the potential of the device's well region or bulk. This allows for fine tuning of the potential (and thus threshold voltage) at the short channel pseudo-FET.

Performance of Devices Having Notched Gate Dielectrics

The performance improvements provided by the notched gate dielectrics of this invention may be explained as follows. Because devices with thin gate dielectrics have high gate capacitances, it can be expected that such devices will have high drive currents. This is because the high capacitance causes a relatively high charge carrier density (r) in the channel region (at a given gate potential).

As noted, drive current is given by the expression I=rv, where r is the linear charge density and v is the charge velocity. The charge density r is given by the following expression:

$$r = Cox(Vgs - Vt)$$

where Cox is the gate capacitance per unit length, Vgs is the gate voltage with reference to the source voltage, and Vt is the device's threshold voltage. As can be seen, by increasing the gate capacitance, the linear charge density also increases.

Unfortunately, while increasing Cox increases charge density, it also increases the load (Q) that a circuit must move, thereby counteracting performance gains.

This can be explained as follows. As noted above, a device's performance may be approximated by f=I/Q, where Q is the charge that must be moved when the circuit switches. This charge is given by the following expression:

$$Q = Cl(Vdd)$$

with $$Cl = Cd + Ci + Cg$$

and where Vdd is supply voltage, Cl is the load capacitance, Cd is the source-drain capacitance, Ci is the interconnect capacitance, and Cg is the gate capacitance. The gate capacitance, Cg, is simply Cox(l), where l is the channel length. Thus, if Cox increases, not only does drive current (I) increase, but circuit load (Q) also increases. From this, is apparent that simply thinning the gate oxide will not necessarily improve an MOS circuit's performance.

Note that the above analysis has been based upon the assumption that any gate thinning occurs across the entire gate length. The present invention, however, employs a notch that is limited to a region over a short channel pseudo-FET. As the short channel pseudo-FET can have an extremely short channel length—on the order of 500 Å or less—the notch need only represent a small fraction of the channel region length. Thus, most of the gate oxide can retain its relatively low value of Cox, and the gate load (Cg) therefore is maintained at a relatively small value, while allowing drive current to be greatly increased. In fact, the long pseudo-FET side oxide can be thickened relative to a standard device, thereby reducing the total gate capacitance below that of the standard device.

As explained, the asymmetric devices of this invention switch on in two stages. First at relatively low gate voltages, the lower threshold, larger channel pseudo-FET switches on, whereupon a sheet of mobile charge carriers forms everywhere in the channel except at the short channel pseudo-device. When the gate voltage is further increased to the point where the short channel pseudo-FET undergoes inversion, the entire MOS device switches on, with nearly all of the potential drop occurring across the short channel pseudo-device. Because the gate capacitance is greatly increased at the short channel pseudo-FET—by introducing a notch—the local charge density increases. Thus, the drive current flowing through the short channel pseudo-FET increases. Remember that I=rv.

This can be further understood by considering the following simple example. Assume that a MOS device has a 0.35 μm drawn channel length, of which 500 Å is used for a short channel pseudo-FET. As for the notched gate oxide, assume that the notch region extends only over the 500 Å of the short channel pseudo-FET, with the notch region oxide thickness being 30 Å and the unnotched region oxide thickness being 65 Å. Because the capacitance is directly proportional to the reciprocal of gate oxide thickness, the gate capacitance (Cg) increase resulting from the notch region is given by (0.30/65+0.05/30)/(0.35/65) or 17 percent. This is a remarkably small increase considering that drive current is more than doubled by the notch. Further, the total increase in Cl will, of course, be less than 17% because Cg represents only one of three contributions to Cl. Thus, the performance increase (f) will nearly double by designing circuits with notched gate oxide devices as described.

Even greater improvements in performance may be obtained by making the unnotched portion the gate dielectric relatively thicker than conventional gate dielectrics. For example, in conventional 0.35 μm devices, the gate oxide thickness is typically about 65 Å. In this invention, as noted, the unnotched regions of the gate dielectric may be as thick as 400 Å. Such thick dielectrics greatly reduce the capacitance in the unnotched region, thereby reducing the load Q and further improving performance f. Of course, the increased thickness decreases the drive current in the channel region under the unnotched region, but this is offset by the very low threshold voltage in this region (which increases the local mobile carrier concentration). Thus, a device having high drive current and low gate capacitance is provided.

Performance of Devices Having Channel Regions With Two Different Threshold Voltages While not wishing to be bound by theory, it is believed that the asymmetric devices of this invention should provide significantly improved performance over other low threshold voltage devices because, at appropriate gate voltages, their behavior is governed by charge carrier transport across a very short effective channel length (on the order of a few hundred angstroms to 0.1 micrometers). Specifically, the device is engineered so that the pocket region under the source or drain creates a short channel pseudo-FET. As noted, it is believed that such asymmetric devices behave like two pseudo-MOS devices in series: a "short channel FET" and a "longer channel FET." Depending upon how the device is designed, one of these will be a source FET and the other will be a drain FET. In the examples shown in FIGS. 1a through 1c, the source FET is the short channel pseudo-FET and the drain FET is the longer channel pseudo-FET. This is illustrated schematically in FIG. 2.

Figure 2:
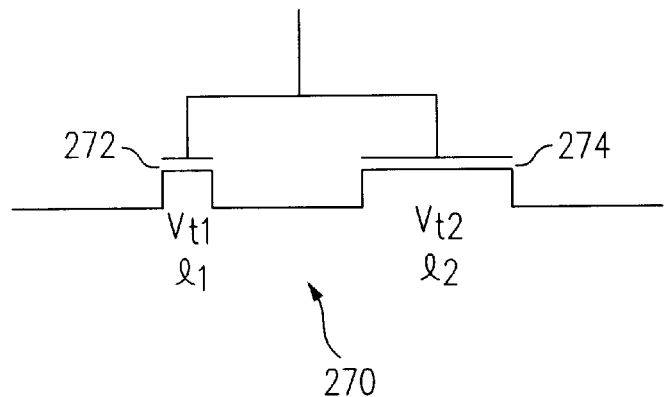
FIG. 2 is a schematic illustration of an MOS transistor of this invention acting as two pseudo-devices in series: a short channel pseudo-FET and a longer channel pseudo-FET.

The pocket region next to the source introduces a local variation in the vertical field in a portion of the channel region near the source. This local change in the vertical field causes a local increase in the threshold voltage so that the device switches on in two stages. As shown in FIG. 2, an asymmetric device 270 having such pocket region acts as a short channel pseudo-FET 272 (source FET) of length 11 having a relatively higher threshold voltage (Vt1) connected in series with a longer channel pseudo-FET 274 (drain FET) of length 12 having a relatively lower threshold voltage (Vt2).

As noted, in very short channel devices, greatly improved performance can be expected due to an increased contribution from ballistic electron transport (i.e., transport without scattering). However, to obtain the improved performance, the asymmetric MOS device (which acts as two pseudo-FETs) should be operated such that its performance is dictated by the short channel pseudo-FET (and hence these short channel effects), and not by longer channel effects (as it would be if the overall MOS structure dictated performance). This can be accomplished by switching such asymmetric device at sufficiently low gate voltages (typically just slightly greater than the threshold voltage of the short channel pseudo-FET—which should be near 0 volts).

In operation, the normal "off" gate voltage surpasses the threshold voltage of the longer channel drain FET, so that this pseudo-FET is always on. In this gate voltage domain, intermediate the threshold voltages of the drain FET and the source FET, an inversion layer forms extending from the drain-channel junction across the channel region to the edge of the source FET. Because no current is flowing, the inversion layer in the channel region acts as an extension of the drain, held at the same potential as the drain. In essence, the relatively large asymmetric halo device has been converted to an extremely small source FET device (in the gate voltage domain between the threshold voltages of the drain FET and the source FET). Now, when the gate voltage exceeds the threshold voltage of the source FET, an abrupt potential drop occurs across the source FET channel as current flows. From a performance standpoint, the pocket implant device appears quite promising because the short channel source FET pseudo-device allows some fraction of the electrons crossing the channel region to do so by very fast ballistic transport in which those electrons are not scattered by the silicon lattice. This, in turn, means that the source FET (and the entire device) should switch very fast under the right conditions.

In view of the above discussion, it should be apparent that asymmetric devices should be engineered such that the channel length of the source FET pseudo-device is made as small as possible (consistent with leakage constraints and avalanche breakdown mechanisms). The various factors that come into play in controlling the source FET channel length include (1) the dopant distribution in the tip of the source, (2) the dopant concentration gradient at the side of the pocket adjacent the channel region, (3) the dopant concentration gradient of the source body adjacent the pocket, and (4) the distance that the pocket extends into or underneath the channel region. By controlling these variables, it is believed that the source FET channel can be made smaller than 0.1 micrometers and are typically in the range of 200 to 500 angstroms. In general, good results should be expected by providing a very steep dopant concentration gradient at the boundary of the pocket and the bulk (well) regions. In one embodiment, the dopant concentration will drop by as much as 3 orders of magnitude over about 3 nanometers between the pocket region and the bulk region. (Such steep gradients have been described in a paper by Sai-Halasz et al., "High Transconductance and Velocity Overshoot in NMOS Devices at the 0.1 $\mu$m Gate-Length Level," IEEE Electron Device Letters, Vol. 9, No. 9, pp. 463–465 (1988) which is incorporated herein by reference for all purposes.) Similarly, the dopant concentration gradients at the source tip-channel region boundary and at the source body-pocket boundary should be comparably steep. Still further, a thin tip region (with a pocket region lying immediately underneath) will generally improve performance by reducing punch through effects. Of course, if the tip region becomes too thin, the source resistance will be too high.

Split Gate Electrode Devices

While the notched gate dielectric of the present invention has been described with reference to asymmetric devices having pocket implants, it could in principle be applied to any device which switches on in two stages (i.e. any device that has two different threshold voltages at different positions in the channel region). One such device is illustrated in FIG. 3.

Figure 3:
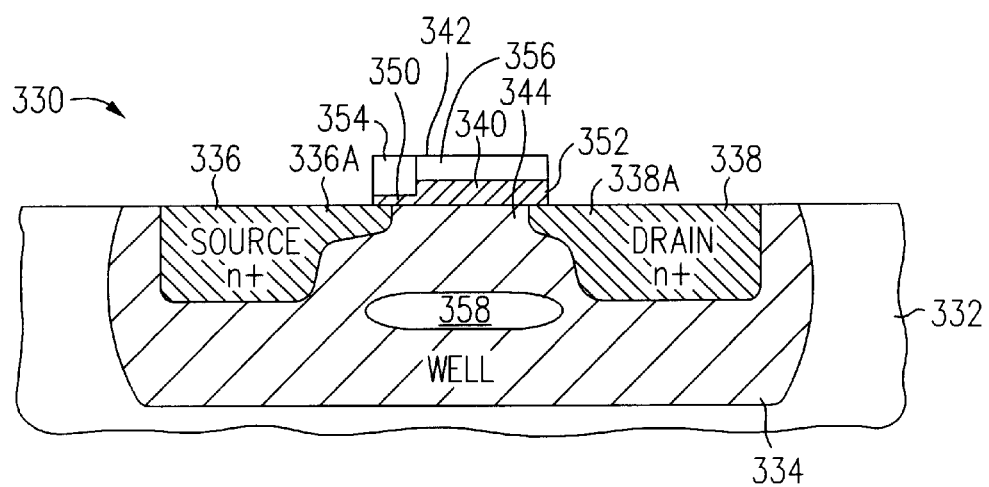
FIG. 3 is a side sectional view of an asymmetric MOS transistor having a notched gate oxide and a split gate in accordance with an embodiment of the present invention.

In FIG. 3, an asymmetric MOS device 330 is shown including a split gate electrode 342 having a p-type polysilicon section 354 and an n-type polysilicon section 356. As shown, the p-type polysilicon section 354 extends over a notch region 350 of gate dielectric 340, and the n-type polysilicon section 356 extends over an unnotched region 352 of gate dielectric 340.

In an NFET, as shown in FIG. 3, the p-type polysilicon section 354 causes the underlying portion of a channel region 344 to have a higher threshold voltage than the remainder of the channel region which underlies n-type polysilicon section 356. Thus, the split gate embodiment, like the pocket implant embodiment, produces a source-FET and a drain-FET which switch on in series as described above. Since the p-type polysilicon section 354 produces a higher threshold voltage region, it should occupy only a relatively short segment of the gate electrode 342, and it should be placed immediately adjacent to the device's source or the drain. Of course, for a PFET, the n-type polysilicon portion of the gate electrode should form the shorter segment. In either case, the short segment should occupy a length of no more than about 1000 Å (0.1 $\mu$m), and more preferably no more than about 700 Å, and most preferably between about 100 and 500 Å. Both the p-type and n-type sections preferably are degenerately doped (e.g., at concentrations of greater than about $10^{20}$ atoms/cm3.

Typically, the channel region of split gate devices will need to be counter doped to decrease the device's threshold voltages to the low levels required for this invention (e.g., near 0 volts for the short channel region and near −1 volt for the long channel region). The counter doping levels used with split gate devices may be of the same order as described above in the context of pocket region devices. Other methods of preventing punch through include providing a pocket region abutting one or both of the source and drain.

In some cases, it may be necessary to provide split gate devices with punch through protection of some sort. This may be accomplished with a buried electrode 358 as shown in FIG. 3. Buried electrode 358 is of the same conductivity type as the semiconductor bulk region, but of a higher dopant concentration. Devices employing such buried electrodes are described in U.S. patent application Ser. No. 08/414,621, filed Mar. 31, 1995, naming Burr and Brassington as inventors, and entitled "LOW POWER HIGH PERFORMANCE JUNCTION TRANSISTOR." That application is incorporated herein by reference in its entirety for all purposes.

Assuming that some mechanism for controlling punch through is provided, there will be no need for a pocket region, as the split gate provides a differential in threshold voltage along the channel region 344. Aside from the features described above, the split gate MOS is otherwise the same the devices shown in FIGS. 1a through 1c. Specifically, the device includes a source 336, a drain 338, and a well 334. It should be noted that, like pocket regions, split gates may profitably be employed in devices that do not include a notched gate dielectric.

Method of Preparing A Notched Gate Dielectric Mos Device

FIGS. 4A–J illustrate some of the important steps employed in fabricating a notched gate oxide MOS device in accordance with the present invention. It should be understood that numerous variations of this process are permissible and within the scope of this invention. Further, although this process is described as a sequence of steps for forming an NFET, the process could be applied equally to a PFET if the conductivity types of the dopants employed in the various steps are reversed. Still further, it should be understood that the conditions recited herein are appropriate for devices in the neighborhood of 0.35 $\mu$M. The process conditions may have to be modified somewhat for devices in other size regimes, as is known in the art.

Figure 4A:
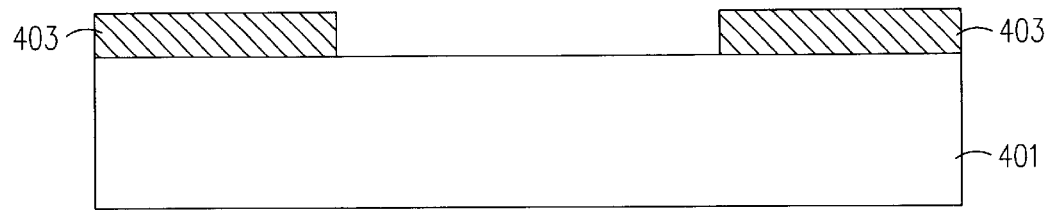
FIGS. 4A–4M are side sectional views of a partially completed transistor in accordance with this invention at various stages of fabrication.

In FIG. 4A, a substrate 401 of monocrystalline silicon or other suitable semiconductor material is provided with an ion implant mask 403 of photoresist or other suitable masking material which exposes a selected portion (the "p-well portion") of substrate 401.

Figure 4B:
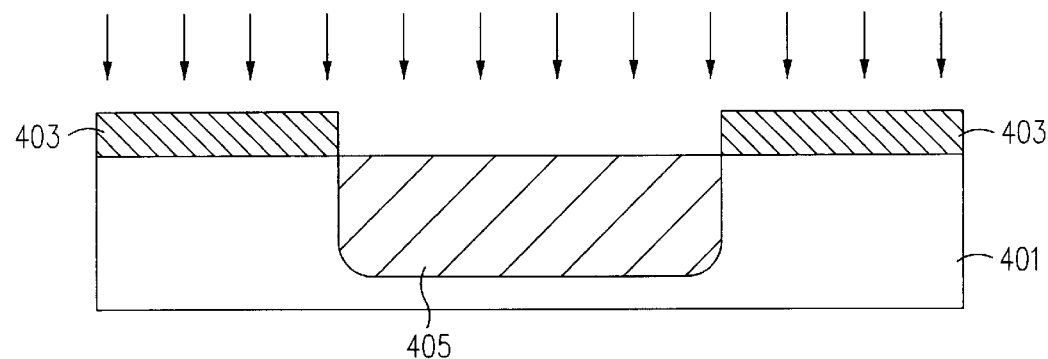

In FIG. 4B, a p-type ion implant is performed over the substrate, penetrating the unmasked portion of the substrate 401 (the "p-well portion"). The p-type dopant is provided at a dose and energy sufficient to provide a very lightly doped well region 405. A subsequent diffusion anneal is conducted at a temperature and for a time sufficient to smooth out the p-type dopant concentration over well region 405 to give a relatively uniform overall very light p-doping level. In alternative embodiments, it may be desirable to form a "retrograde well" to prevent punch through. Such wells have a higher dopant concentration near the bottom of the well, away from the channel region. Either way, the well formation conditions should be chosen such that the p-well region has a p-type dopant concentration at the substrate surface (i.e., the channel region) of between about $1\times10^{14}$ and $1\times10^{16}$ atoms/cm3 (as discussed above). It should be noted that in some systems, the single crystal silicon substrate 401 is grown with a specific p-type dopant concentration in this range. In other embodiments, a layer of silicon of the desired bulk concentration is grown epitaxially on top of a heavily doped substrate. In such cases, there will be no need to perform the above steps of forming a p-well.

Figure 4C:
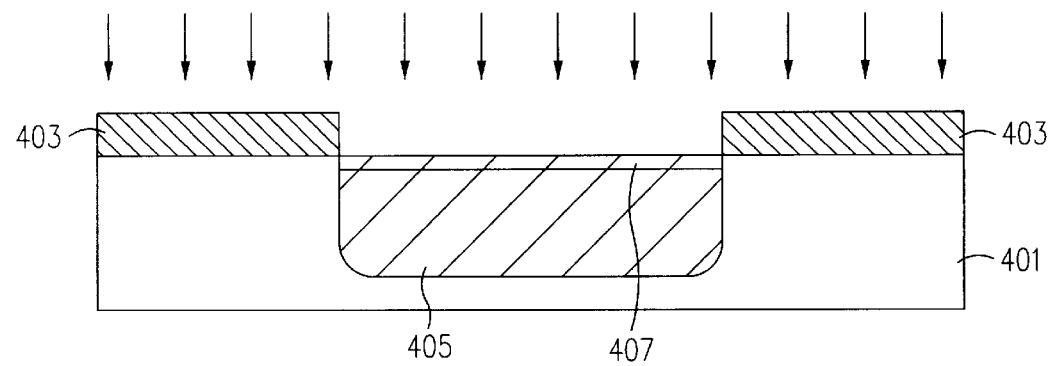

As shown in FIG. 4C, a counter dopant implant is performed to generate a thin region 407 of n-type dopant at the channel of the device. This implant is performed under conditions suitable for forming a counter doped region of between about $10^{16}$ to $10^{18}$ cm−3.

Figure 4D:
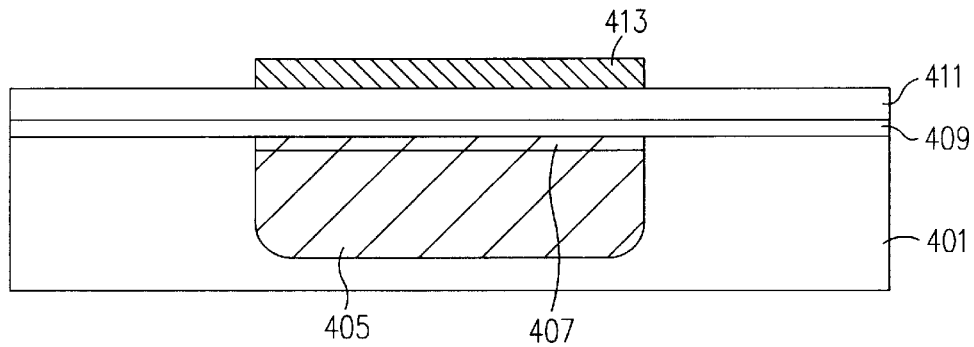

To obtain the structure shown in FIG. 4D, the mask 403 is removed and a pad oxide 409 (silicon dioxide) covering the substrate 401 is grown to a thickness of between about 30 and 80 nanometers at a temperature in the range of about 700 to 1000 C. Next, a layer of silicon nitride 411 is deposited, typically by low pressure chemical vapor deposition (LPCVD), to a thickness of between about 0.1 and 0.2 micrometers on pad oxide 409. Thereafter, a resist mask 413 is provided to protect the active areas (i.e., regions where active transistors are to be formed).

Figure 4E:
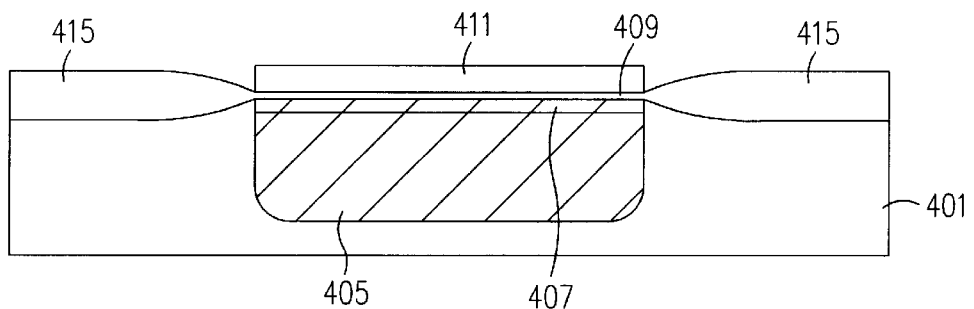
Figure 4F:
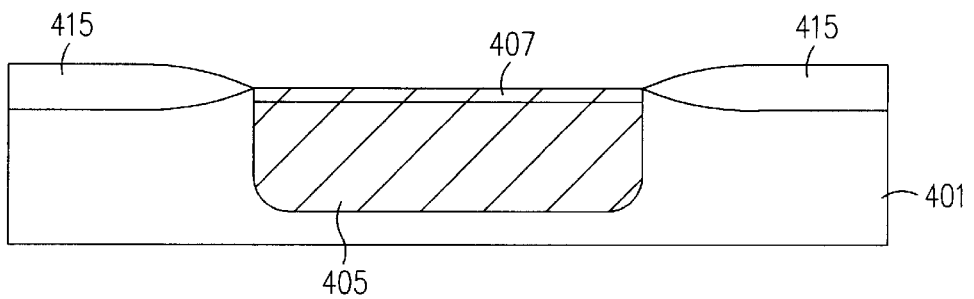
Figure 4G:
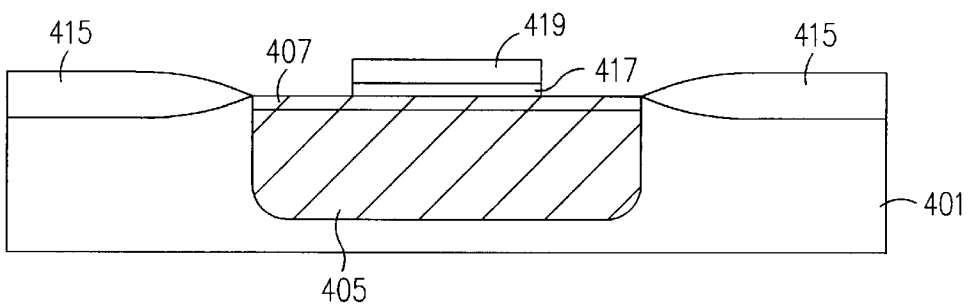

The structure shown in FIG. 4E is then prepared as follows. A dry etch (typically a reactive ion etch or RIE) is performed on the exposed nitride and oxide layers to produce a bare silicon surface in these regions. Next, the resist mask 413 is removed and a thick field oxide 415 (silicon dioxide) is grown at a temperature of between about 700 and 1000 C to a thickness of between about 0.2 and 0.5 micrometers to produce the structure shown in FIG. 4E. Thereafter, this structure is selectively etched to remove nitride layer 411, typically by a wet etch with orthophosphoric acid. Then pad oxide 409 is removed by a timed wet etch to expose the silicon substrate in the active device regions. This produces a structure as shown in FIG. 4F. The field oxide 415 is used to electrically isolate the various devices on a chip.

Although the process shown herein employs a field oxide for purposes of device isolation, other device isolation techniques could also be employed. For example, in an alternative embodiment, trenches filled with dielectric material such as boro phosphosilicate glass could be used in place of the field oxide to isolate devices on the chip. Processes for forming trench isolation regions are known in the art.

After the bare silicon substrate has been exposed, a relatively thick gate oxide 417 is grown on the silicon surface at a temperature of between about 800 and 950 C to a thickness of between about 6 and 40 nanometers. After the gate oxide has been formed, a gate layer 419 of polysilicon is deposited over the surface to a thickness of between about 100 and 300 nanometers. On this layer, a resist mask is defined to protect the transistor gate region. Then, the exposed polysilicon is selectively etched and the resist mask is removed to provide the structure shown FIG. 4G.

As described, the gate dielectric is a single layer of material such as silicon dioxide. However, in alternative embodiments, it may also be a multi-layer structure including silicon nitride.

Figure 4H:
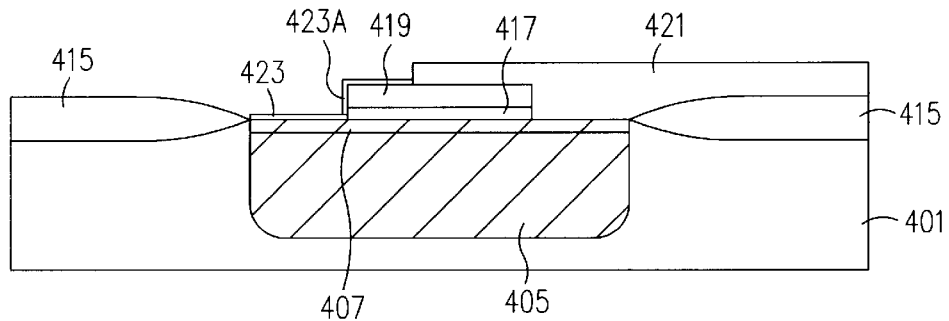

A mask 421 is now formed on the substrate from the polysilicon layer 419 along the right side (a drain side) of the partially fabricated MOS device as shown in FIG. 4H. Then, a very thin gate oxide layer 423 is grown at a temperature of between about 800 and 950 C on the exposed substrate surfaces adjacent to the thicker gate oxide layer 417. Preferably, the thin gate oxide layer 423 is between about 2 and 4 nanometers thick. Regardless of its actual thickness, it will be thinner than the adjacent gate oxide layer 417. In this way, a notch is provided in the device's final gate oxide. Note that a thin vertical layer of oxide 423A will form on the side of polysilicon layer 419.

Figure 4I:
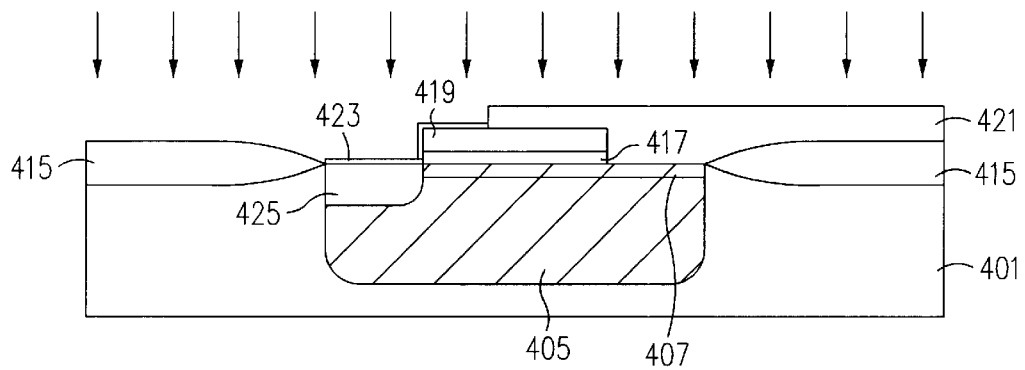

Next, as shown in FIG. 4I, a p-type halo implant is conducted at an energy and dosage sufficient to form an asymmetric pocket region 425. For example, the asymmetric halo implant might be conducted with boron implanted at about $5 \times 10^{12}$ to $5 \times 10^{13}$ cm−2 at an energy of between about 50 and 70 keV. In some embodiments, indium may be an appropriate dopant because this element has a relatively small diffusion coefficient and can therefore form pockets having rather steep concentration profiles. In the case of a PFET, antimony may be used because it too has a relatively small diffusion coefficient.

Figure 4J:
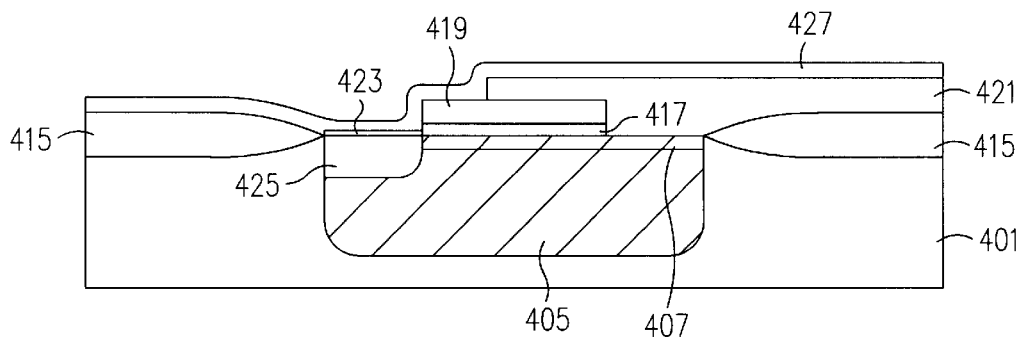

At this point, a polysilicon layer 427 is conformally deposited over the entire structure as shown in FIG. 4J. Preferably, the layer 427 is no more than about 1000 Å thick. In general, it should be as thick as short channel pseudo-FET's channel length.

Next, the layer 427 is anisotropically etched to remove polysilicon until the underlying thin gate oxide layer 423 is exposed. Note that a portion of oxide layer 423 immediately adjacent to the thicker gate oxide layer 417 will remain protected under the polysilicon layer 427. This protected section forms the notch region of the final device.

Figure 4K:
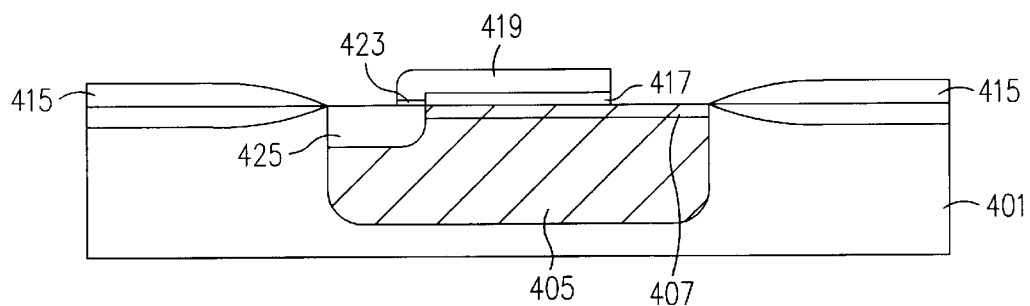

After the polysilicon layer 427 has been anisotropically etched as described, the unprotected portion of oxide layer 423 is etched to expose the underlying silicon substrate 401. Thereafter, the mask 421 is removed to produce a structure as shown in FIG. 4K.

Figure 4L:
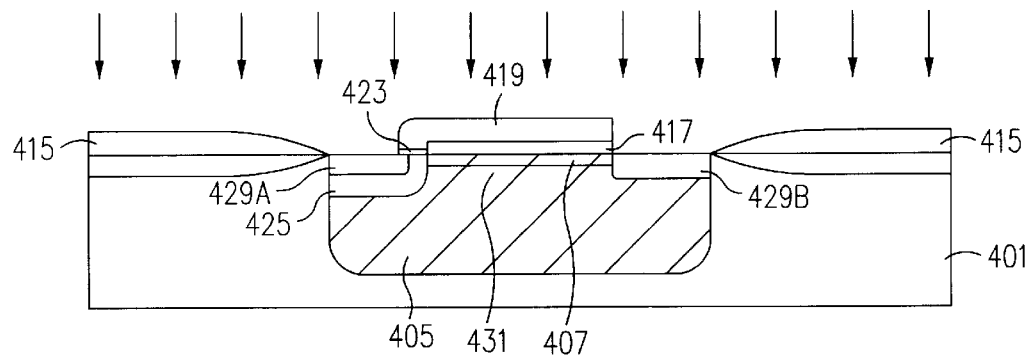

Next as shown in FIG. 4L, an n-type ion implant is conducted at an ion dose of about $10^{13}$–$10^{14}$ cm−2 and an ion kinetic energy of between about 20 and 60 keV with ions drawn from P, As, Sb, or Sn. This implant is performed over the entire substrate, penetrating the p-well portion of the apparatus to form two n doped layers 429A and 429B flanking a p-type channel region 431 to the left and right, respectively, within the p-well 405. This implant is intended to form a device's source and drain "tip" regions which extend to the edge of the channel region. As shown, a p-type pocket region 425 remains below the source tip region 429A. In preferred embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times, or by using rapid thermal annealing ("RTA") as known in the art.

Figure 4M:
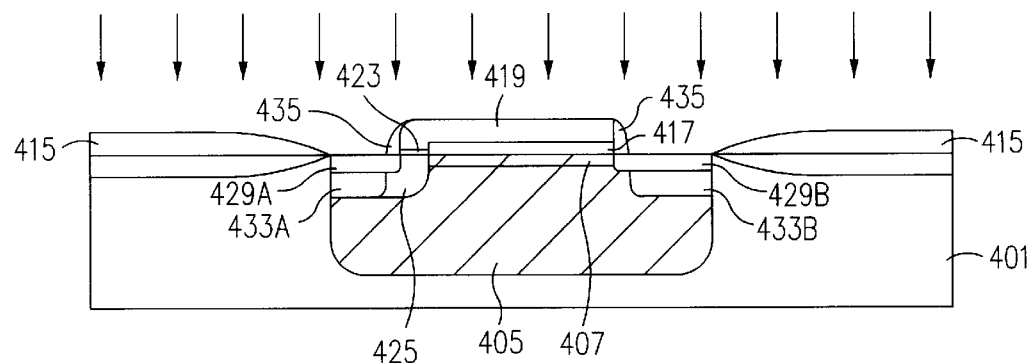

After the tip regions have been formed, "plug" regions 433A and 433B of the source and drain shown in FIG. 4M are formed as follows. Initially, a blanket oxide insulating layer is deposited over the device. Most of this layer is then anisotropically etched away, leaving side wall insulating spacers 435 of width 50 to 150 nm, flanking the polysilicon gate 419 on the right and left as shown in FIG. 4M. Thereafter, an n-type ion implant (ion dose=$1 \times 10^{15}$–$5 \times 10^{15}$ cm2; ion kinetic energy=50–100 keV; ions drawn from P, As, Sb, or Sn) is performed over the substrate, penetrating the p-well portion of the structure. This produces drain and source plugs 433A and 433B of increased n-type doping. After drain and source layers 433A and 433B have been formed, an anneal step is performed. In preferred embodiments, this is the only anneal step conducted after the pocket, tip, and plug implants. In other words, no anneal step is performed after the asymmetric pocket and tip implants. This limited annealing allows the halo and tip regions to maintain relatively steep concentration gradients near the channel region.

As can be seen in FIG. 4M, after the plug regions of the source and drain are formed, an asymmetric pocket region 425 remains under source tip 429A and adjacent to the channel region.

After the source and drain regions have been formed, it may be necessary to form a silicide layer (e.g., TiSi) over the entire substrate and particularly over the gate poly region. A thin vertical strip of oxide 423A may remain between the source side of the gate poly and the drain side of the gate poly 419. As noted, this vertical strip is a remnant of the thin source oxide formed as part of the notched gate dielectric. The silicide layer is formed to ensure that electrical contact exists between the two sides of the gate polysilicon, despite the vertical strip of oxide 423A.

At this point, an insulating layer is formed over the device, and apertures or vias are selectively etched and filled with metal, such as aluminum, tungsten, titanium or other electrically conductive material to provide electrical contacts for the various device elements.

While the above method produced a gate electrode 419 having only a single conductivity type, the method could be modified slightly to produce a split gate electrode. Specifically, the polysilicon layer 419 could be formed as n-type material or subsequently doped n-type. Thereafter, the polysilicon layer 427, deposited as described with reference to FIG. 4J, could be formed as p-type material. In this manner, the resulting gate electrode would be a split gate electrode as described with reference to FIG. 3.

Conclusion

Although certain embodiments of the present invention have been described, it should be understood that the present invention may be embodied in many other specific forms without departing from the spirit or scope of the invention. Particularly, the NFETs illustrated above can be replaced with PFETs. Further, the devices of this invention can be implemented in an SOI (silicon on insulator) structure rather than the bulk-silicon-based structure described above. SOI structures include a base layer of bulk silicon on top of which is provided a layer of bulk silicon dioxide. Finally, on top of the silicon dioxide layer, a thin epitaxial layer of silicon—typically in the range of 70 to 2000 angstroms—is provided to form the device elements (source, drain, and channel region). Still further, the devices of this invention may be operated over a wide range of temperatures. At low temperatures, the mean free path of electrons in silicon increases so that more electrons are transported ballistically, thereby potentially improving performance. Therefore, the present examples are to be considered as illustrative and not restrictive, and the invention is not to be limited to the details given herein, but may be modified within the scope of the appended claims.

What is claimed is:

1. An asymmetric MOS device on a semiconductor substrate having an active surface, the asymmetric MOS device comprising:

a bulk region in the semiconductor substrate of a first conductivity type;

source and drain regions positioned within said bulk region and being of a second conductivity type;

a channel region located along said substrate active surface and between the source and drain regions, the channel region having an associated channel length representing the distance in said channel region between the source and drain regions;

a gate dielectric layer positioned over the channel region and having a notch region over a portion of the channel region; and a gate electrode positioned over the gate dielectric, the gate electrode having a first lateral section of said first conductivity type and having a second lateral section of said second conductivity type, said first lateral section having a first lateral section length which extends parallel to said substrate active surface and a first lateral section height which extends perpendicular to said substrate active surface, said second lateral section having a second lateral section length which extends parallel to said substrate active surface and a second lateral section height which extends perpendicular to said substrate active surface, wherein said first lateral section length is shorter than said second lateral section length and said first lateral section height is higher than said second lateral section height and further wherein, a junction between said first and second lateral sections is located over said channel region between said source and drain regions such that a first portion of said channel region underlying said first lateral section has a locally high threshold voltage and a second portion of said channel region underlying said second lateral section has a locally low threshold voltage, said first portion of said channel region having a first portion length which extends parallel to said substrate active surface which is shorter than a second portion length of said second portion of said channel region which extends parallel to said substrate active surface so as to define an asymmetric channel.

2. The asymmetric MOS device of claim 1 wherein the first and second lateral sections are degenerately doped.

3. The asymmetric MOS device of claim 1 wherein the channel region is counter doped with a dopant of the second conductivity type.

4. The asymmetric MOS device of claim 1 wherein the first lateral section is no more than about 0.1 $\mu$m in length.

5. The asymmetric MOS device of claim 1 wherein the gate dielectric layer has a notch region over a portion of the channel region.

6. The asymmetric MOS device of claim 1 wherein the first lateral section overlies the notch region of the gate dielectric layer.

7. The asymmetric MOS device of claim 1 further comprising a buried electrode of said first conductivity type located beneath the channel region, wherein said buried electrode has an average dopant concentration which is greater than an average dopant concentration of the bulk region.

8. The asymmetric MOS device of claim 1 further comprising a pocket region of the first conductivity type, the pocket region abutting one of said source or drain regions and proximate said channel region, the pocket region having an average concentration of dopant atoms of the first conductivity type, which average concentration is greater than the bulk region's average concentration of dopant atoms.

* * * * *